(12) United States Patent (10) Patent No.: US 9,053,804 B2
Wu et al. (45) Date of Patent: Jun. 9, 2015

(54) REDUCED COMPLEXITY RELIABILITY COMPUTATIONS FOR FLASH MEMORIES

(71) Applicant: LSI Corporation, San Jose, CA (US)

(72) Inventors: Yunxiang Wu, Cupertino, CA (US); Zhengang Chen, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 38 days.

(21) Appl. No.: 13/777,484

(22) Filed: Feb. 26, 2013

(65) Prior Publication Data

US 2014/0241056 A1 Aug. 28, 2014

(51) Int. Cl.
*G11C 16/26* (2006.01)
*G11C 11/56* (2006.01)

(52) U.S. Cl.
CPC ............ *G11C 16/26* (2013.01); *G11C 11/5642* (2013.01)

(58) Field of Classification Search
None
See application file for complete search history.

(56) References Cited

U.S. PATENT DOCUMENTS

2010/0034018 A1* 2/2010 Yang et al. ............... 365/185.2

* cited by examiner

*Primary Examiner* — James G Norman
(74) *Attorney, Agent, or Firm* — Ryan, Mason & Lewis, LLP

(57) ABSTRACT

Methods and apparatus are provided for computing reliability values, such as log likelihood ratios (LLRs), with reduced complexity for flash memory devices. Data from a flash memory device that stores M bits per cell using 2^M possible states is processed by obtaining at least two soft read voltage values corresponding to two reference voltages $V_0$ and $V_1$, wherein the two reference voltages $V_0$ and $V_1$ are between two adjacent states of the 2^M possible states; and converting the at least two soft read voltage values to a log likelihood ratio for a region between the two reference voltages $V_0$ and $V_1$ using probability density functions only for the two adjacent states. The soft read voltage values comprise, for example, hard decision read values obtained by a plurality of read retries of a given cell at a plurality of reference voltages and/or soft values obtained from the flash memory device.

20 Claims, 5 Drawing Sheets

REDUCED COMPLEXITY RELIABILITY COMPUTATIONS FOR FLASH MEMORIES

CROSS-REFERENCE TO RELATED APPLICATIONS

The present application is related to United States Patent Application entitled, "Methods and Apparatus for Approximating a Probability Density Function or Distribution for a Received Value in Communication or Storage Systems;" United States Patent Application entitled "Methods and Apparatus for Computing a Probability Value of a Received Value in Communication or Storage Systems," and United States Patent Application entitled "Methods and Apparatus for Computing Soft Data or Log Likelihood Ratios for Received Values in Communication or Storage Systems," each filed Mar. 31, 2010, and U.S. patent application Ser. No. 13/001,278, filed Feb. 25, 2011, entitled "Methods and Apparatus for Read-Side Intercell Interference Mitigation in Flash Memories," (now U.S. Pat. No. 8,462,549), U.S. patent application Ser. No. 13/063,888, filed Aug. 31, 2011, entitled "Methods and Apparatus for Soft Data Generation in Flash Memories" (now U.S. Pat. No. 8,830,748); and U.S. patent application Ser. No. 13/731,551, filed Dec. 31, 2012, entitled "Multi-Tier Detection and Decoding in Flash Memories," each incorporated by reference herein.

FIELD

The present invention relates generally to flash memory devices and more particularly, to improved techniques for mitigating the effect of noise, inter-cell interference and other distortions in such flash memory devices with low overall processing delay.

BACKGROUND

A number of memory devices, such as flash memory devices, use analog memory cells to store data. Each memory cell stores an analog value, also referred to as a storage value, such as an electrical charge or voltage. The storage value represents the information stored in the cell. In flash memory devices, for example, each analog memory cell typically stores a certain voltage. The range of possible analog values for each cell is typically divided into threshold regions, with each region corresponding to one or more data bit values. Data is written to an analog memory cell by writing a nominal analog value that corresponds to the desired one or more bits. The analog values stored in memory cells are often distorted. The distortions are typically due to, for example, back pattern dependency (BPD), noise and inter-cell interference (ICI).

A probability density function (PDF) of a continuous random variable describes the relative probability that a given value of the random variable will occur at a given point in time. The voltage distributions for memory cells, for example, are often expressed using such probability density functions. Generally, the threshold voltage of a cell is the voltage that needs to be applied to the cell so that the cell conducts a certain amount of current. The threshold voltage is a measure for the data stored in a cell.

Statistical noise in a communication system, for example, is typically approximated using a probability density function having a normal distribution (often referred to as a Gaussian distribution). Computing probability values for a Gaussian distribution is relatively straightforward. The above-described distortions in memory devices, however, as well as imperfections in the write process, may cause the probability density function for received values read from the memory to have an arbitrary or non-Gaussian distribution. The computation of probability values for such arbitrary distributions is significantly more complex than for a Gaussian distribution.

A need therefore exists for improved methods and apparatus for computing probability values for received or stored values that have an arbitrary probability density function. A further need exists for methods and apparatus for approximating a probability density function or distribution for a received value in communication or storage systems.

SUMMARY

Generally, methods and apparatus are provided for computing reliability values, such as log likelihood ratios (LLRs), with reduced complexity for flash memory devices. According to one aspect of the invention, data from a flash memory device that stores M bits per cell using $2^M$ possible states is processed by obtaining at least two soft read voltage values corresponding to two reference voltages $V_0$ and $V_1$, wherein the two reference voltages $V_0$ and $V_1$ are between two adjacent states of the $2^M$ possible states; and converting the at least two soft read voltage values to a log likelihood ratio for a region between the two reference voltages $V_0$ and $V_1$ using probability density functions only for the two adjacent states.

The soft read voltage values comprise, for example, hard decision read values obtained by a plurality of read retries of a given cell at a plurality of reference voltages and/or soft values obtained from the flash memory device. In one exemplary embodiment, the probability density functions for each of the two adjacent states $S_n$ and $S_{n+1}$ can be expressed as $f(v;\mu_n,\sigma_n^2)$ and $f(v;\mu_{n+1},\sigma_{n+1}^2)$, where the probability density functions are defined by a mean $\mu_n$ and a variance $\sigma_n^2$ and $v$ is the soft read voltage.

A more complete understanding of the present invention, as well as further features, aspects, embodiments and advantages of the present invention, will be obtained by reference to the following detailed description and drawings.

DETAILED DESCRIPTION

Various aspects of the invention are directed to signal processing and error code correction (ECC) techniques for mitigating ICI, noise and other distortions in memory devices, such as single-level cell or multi-level cell (MLC) NAND flash memory devices. As used herein, a multi-level cell flash memory comprises a memory where each memory cell stores two or more bits. For example, a multi-level cell that stores one bit-per-cell is referred to as SLC, that stores two bits-per-cell is referred to as MLC and that stores three bits-per-cell is referred to as TLC. Typically, the multiple bits stored in one flash cell belong to different pages. While the invention is illustrated herein using memory cells that store an analog value as a voltage, the present invention can be employed with any storage mechanism for flash memories, such as the use of voltages, currents or resistances to represent stored data, as would be apparent to a person of ordinary skill in the art.

According to one aspect of the invention, reduced complexity LLR computations are provided with reduced costs and reduced computation time (thereby improving throughput performance). As discussed hereinafter, aspects of the present invention provide reduced complexity reliability values for a region between two adjacent reference voltages during a soft read retry operation by considering the probability density functions for only the two states that are adjacent to the region.

Figure 1:
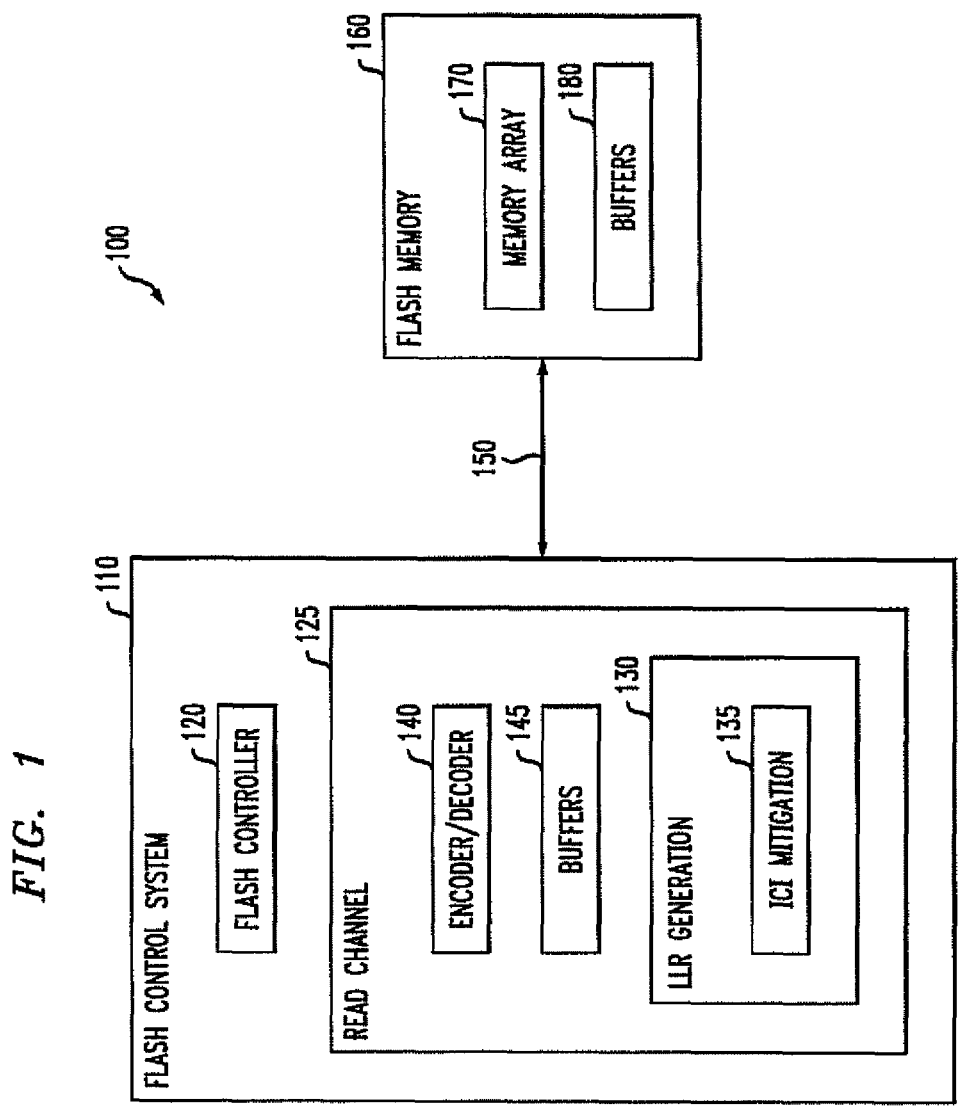
FIG. 1 is a schematic block diagram of an exemplary flash memory system incorporating detection and error correction techniques in accordance with the present invention.

FIG. 1 is a schematic block diagram of an exemplary flash memory system 100 incorporating detection and coding techniques in accordance with aspects of the present invention. As shown in FIG. 1, the exemplary flash memory system 100 comprises a flash control system 110 and a flash memory block 160, connected by an interface 150. The exemplary flash control system 110 comprises a flash controller 120, and a read channel 125. Moreover, the read channel 125 further comprises an encoder/decoder 140, buffers 145 and an LLR generation block 130. Finally, the LLR generation block 130 further comprises an ICI mitigation block 135.

The exemplary flash controller 120 implements one or more detection and error correction coding/decoding processes that incorporate aspects of the present invention.

The exemplary read channel 125 comprises an encoder/decoder block 140 and one or more buffers 145. It is noted that the term "read channel" can encompass the write channel as well. In an alternative embodiment, the encoder/decoder block 140 and some buffers 145 may be implemented inside the flash controller 120. The encoder/decoder block 140 and buffers 145 may be implemented, for example, using well-known commercially available techniques and/or products, as modified herein to provide the features and functions of the present invention. As discussed hereinafter, the exemplary encoder/decoder block 140 comprises a soft-decision ECC decoder.

Generally, as discussed further below, the exemplary LLR generation block 130 processes one or more read values from the flash memory 160, such as single bit hard values and/or quantized multi-bit soft values, and generates reliability and/or LLR values that are applied to the decoder 140, such as an exemplary soft decision error correction code (ECC) decoder, such as a low density parity check (LPDC) decoder. In this disclosure, the terms reliability and LLR values are used interchangeably, and approximations of LLRs are included in this definition as well.

In the exemplary embodiment, the exemplary ICI mitigation block 135 is a function in the LLR generation block 130 that accounts for interference between physically adjacent cells in generating the LLR sequence.

The exemplary flash memory block 160 comprises a memory array 170 and one or more buffers 180 that may each be implemented using well-known commercially available techniques and/or products.

In various embodiments of the disclosed detection and coding/decoding techniques, the exemplary interface 150 may need to convey additional information relative to a conventional flash memory system, such as values representing information associated with aggressor cells. Thus, the interface 150 may need to have a higher capacity or faster rate than an interface in conventional flash memory systems. On the other hand, in other embodiments, this additional information is conveyed to flash controller 120 in a sequential manner which would incur additional delays. However, those additional delays do not notably increase the overall delay due to their rare occurrence. When additional capacity is desired, the interface 150 may optionally be implemented, for example, in accordance with the teachings of International Patent Application Serial No. PCT/US09/49328, filed Jun. 30, 2009, entitled "Methods and Apparatus for Interfacing Between a Flash Memory Controller and a Flash Memory Array," (now U.S. Pat. No. 8,677,056), incorporated by reference herein, which increases the information-carrying capacity of the interface 150 using, for example, Double Data Rate (DDR) techniques.

During a write operation, the interface 150 transfers the program values to be stored in the target cells, typically using page or wordline level access techniques. For a more detailed discussion of exemplary page or wordline level access techniques, see, for example, International Patent Application Serial No. PCT/US09/36810, filed Mar. 11, 2009, entitled "Methods and Apparatus for Storing Data in a Multi-Level Cell Flash Memory Device with Cross-Page Sectors, Multi-Page Coding and Per-Page Coding," (now U.S. Pat. No. 8,724,381), incorporated by reference herein.

During a read operation, the interface 150 transfers hard and/or soft read values that have been obtained from the memory array 170 for target and/or aggressor cells. For example, in addition to read values for the page with the target cell, read values for one or more neighboring pages in neighboring wordlines or neighboring even or odd bit lines are transferred over the interface 150. In the embodiment of FIG. 1, the disclosed detection and coding/decoding techniques are implemented outside the flash memory 160, typically in a process technology optimized for logic circuits to achieve the lowest area. It is at the expense, however, of the additional aggressor cell data that must be transferred on the interface 150.

Figure 2:
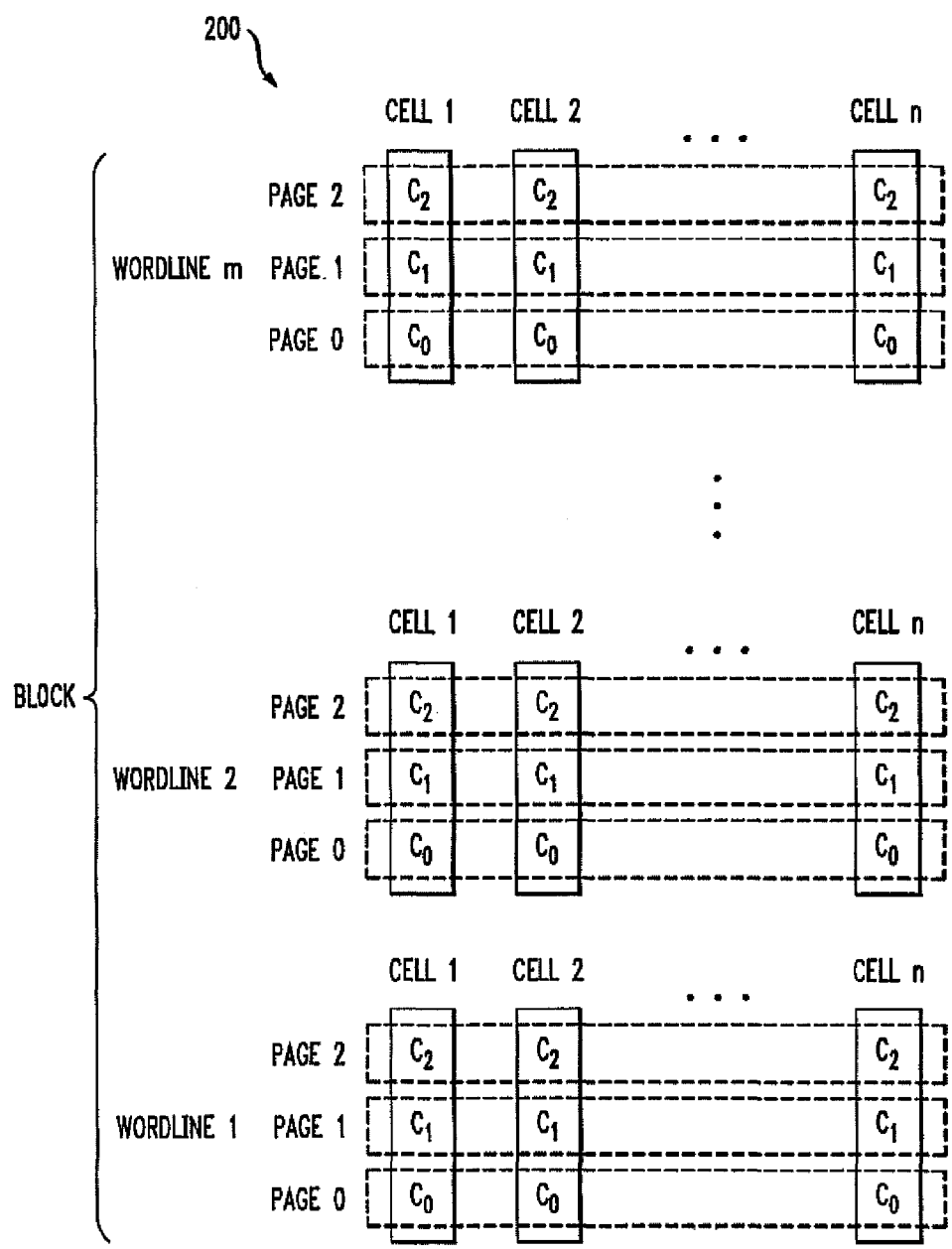
FIG. 2 illustrates an exemplary flash cell array in a multi-level cell (MLC) flash memory device in further detail.

FIG. 2 illustrates an exemplary flash cell array 200 in a multi-level cell (MLC) flash memory device 160 in further detail. As shown in FIG. 2, the exemplary flash cell array 200 stores three bits per flash cell, $c_i$. FIG. 2 illustrates the flash cell array architecture for one block, where each exemplary cell typically corresponds to a floating-gate transistor that stores three bits. The exemplary cell array 200 comprises m wordlines and n bitlines. Typically, in current multi-page cell flash memories, the bits within a single cell belong to different pages. In the example of FIG. 2, the three bits for each cell correspond to three different pages, and each wordline stores three pages. In the following discussion, pages 0, 1, and 2 are referred to as the lower, middle, and upper page levels within a wordline.

As indicated above, a flash cell array can be further partitioned into even and odd pages, where for example cells with even numbers (such as cells 2 and 4 in FIG. 2) correspond to even pages, and cells with odd numbers (such as cells 1 and 3 in FIG. 2) correspond to odd pages. In this case, a page (such as page 0) would contain an even page (even page 0) in even cells and an odd page (odd page 0) in odd cells.

In a two-level cell, for example, each cell stores two bits. In one exemplary implementation, Gray mapping {11, 01, 00, 10} is employed where bits in a cell belong to two different pages. The bits for the two pages in each cell are often referred to as the least significant bit (LSB) and the most significant bit (MSB). For example, if the bit pattern 01 is stored in a cell, "1" is the LSB corresponding to the lower page and "0" is the MSB corresponding to the upper page. In the exemplary embodiment, the lower page is programmed before the upper page. Experimental studies of flash memory devices indicate that for example the error event "01"→"10" (pattern "10" is read even though pattern "01" was written) has considerable occurrence probability at the end of device life. In addition, based on an additive white Gaussian noise (AWGN) model, the MSB page often exhibits a higher bit error rate (BER) compared to the LSB page. Thus, it has been found that reading one page improves the BER of the other.

Soft Read on Flash Memory

A NAND flash memory cell is a floating gate transistor. Depending on the charge amount on the floating gate, the threshold voltage (Vt) of the transistor may be different. By "programming" the cell, the floating gate charge amount is changed, thereby representing a certain amount of information to be stored in a non-volatile fashion. To read the information from the cell, a reference voltage (Vref or Vread) is applied to the control gate of the transistor. If Vref is higher than Vt, the transistor is turned on, otherwise the transistor is turned off, and therefore the information stored in the cell is detected by sensing the current flowing through the channel of the transistor. Thus, a flash memory is a hard-decision (HD) read, since only one bit of information can be obtained from the on-off state of the transistor.

As device sizes reduce, the bit error rate (BER) of NAND flash memory devices degrades. To maintain reliability levels, soft decoded error correction codes (ECC) are increasingly being employed, such as low density parity check (LDPC) codes. These ECC codes are more powerful in correcting errors but they require the input to the decoder to be soft information of flash channels. The soft information is normally in the form of log likelihood ratios (LLRs). Since flash memory devices 160 typically do not provide soft decision information to the flash controller 120, flash controllers 120 must compute such soft decision information.

Aspects of the present invention recognize that reducing the complexity of LLR computation will provide simpler hardware/firmware with reduced costs and reduced computation time (thereby improving throughput performance). As discussed more fully below, in one exemplary embodiment of the present invention, the computational complexity is reduced by 50% for MLC devices, by 75% for TLC devices, and by even more for 4-bit-per cell flash devices.

In order to store M bits per cell, a cell is programmed to $2^M$ possible states (or levels). Therefore, there are two states for SLC devices, four states for MLC devices, 8 states for TLC devices, and 16 states for 4-bit-per-cell devices. Due to various noise and distortions, the actual voltage of a state (level) after programming does not corresponding directly to the target voltage. Instead, the voltage can be approximately modeled using a Gaussian random number. Generally, for a Gaussian PDF, the log likelihood calculation simplifies to a distance calculation, as a Gaussian PDF is completely defined by its mean and variance. In general, each state has a different mean and a different variance. In order to obtain high quality soft decisions, multiple reads with different read reference voltages (Vref) need to be performed around the cross point of the corresponding distributions.

Figure 3:
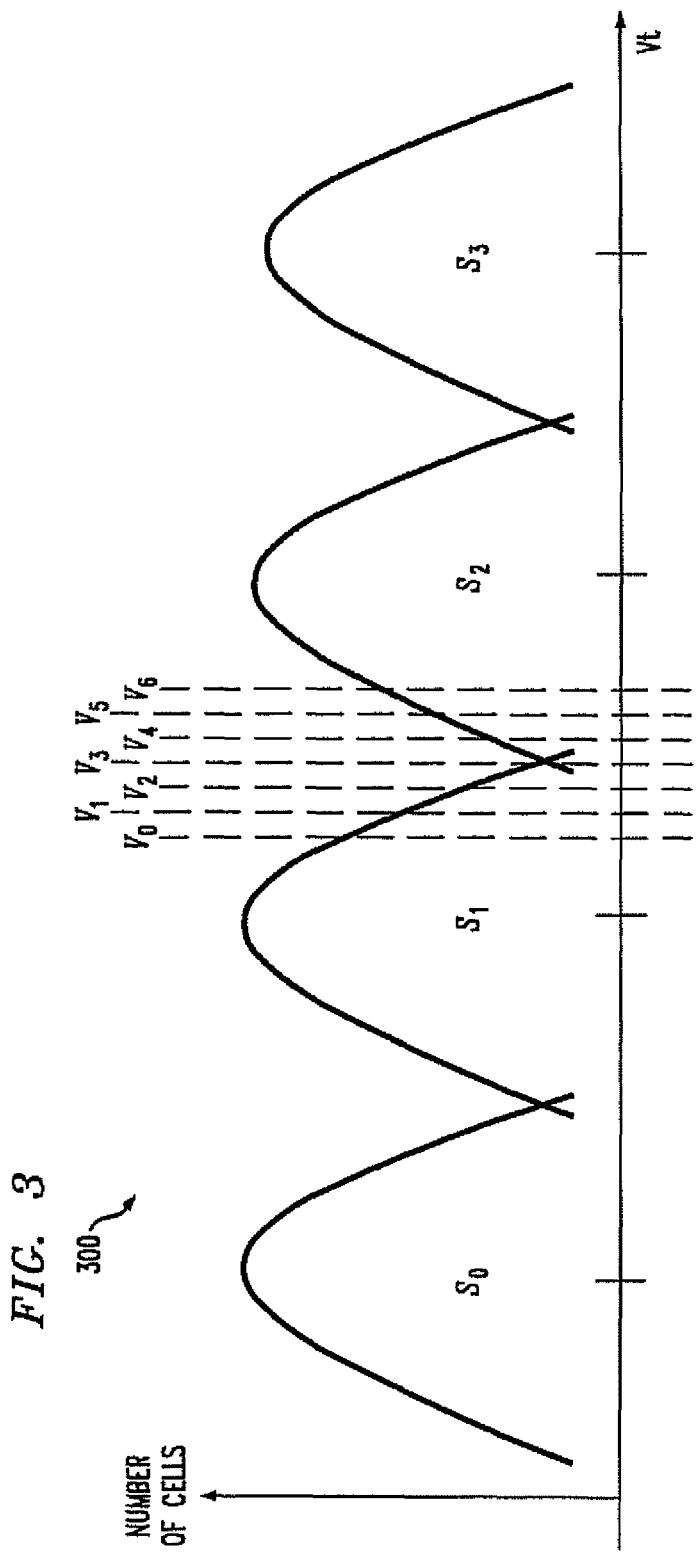
FIGS. 3 and 4 illustrate an exemplary soft read operation with seven exemplary hard decision read operations with different reference voltages $V_0$-$V_6$ for obtaining soft decisions on a least significant bit (LSB) page and a most significant bit (MSB) page, respectively.

A "soft read" operation on a flash memory device 160 is thus comprised of multiple HD reads, usually with different Vrefs. FIG. 3 illustrates an exemplary soft read operation 300 with seven exemplary hard decision read operations with different Vrefs $V_0$-$V_6$ for obtaining soft decisions on a least significant bit (LSB) page. As shown in FIG. 3, seven exemplary HD read operations can be performed with different Vrefs $V_0$-$V_6$ by the flash controller 120 or the flash memory device 160 itself (if the device 160 has a built-in soft read command). A soft read operation thus divides the entire Vt region into a number of decision regions (e.g., the 7 regions created by Vrefs $V_0$-$V_6$ in FIG. 3) around the cross point of the corresponding distributions. Typically, a soft decision ECC decoder 140 is used in the flash controller 120 to leverage the soft information extracted from soft reads and to improve the read reliability of the flash memory.

FIG. 3 illustrates an exemplary threshold voltage distribution for an exemplary multi-level cell flash memory having four states $S_0$-$S_3$ (two bits-per-cell). As previously indicated, the threshold voltage of a cell is the voltage that needs to be applied to the cell so that the cell conducts a certain amount of current. The threshold voltage is a measure for the data stored in a cell. In the exemplary embodiment shown in FIG. 3, each storage element employs four possible data states $S_0$-$S_3$ to store two bits of data in each memory cell. FIG. 3 illustrates four peaks, with each peak corresponding to one state $S_0$-$S_3$. In a multi-level cell flash device, the different peaks of the threshold voltage distribution graph are used for storing two bits in the cell.

For example, the cell voltage distribution represents a distribution of the cell voltages $V_t$ of the cells within the array that are in state $S_0$ ("11" data state), $S_1$ state ("01" data state), $S_2$ state ("00" data state) and $S_3$ state ("10" data state). Thus, the transition between states $S_1$ and $S_2$ correspond to the LSB in FIG. 3.

Figure 4:
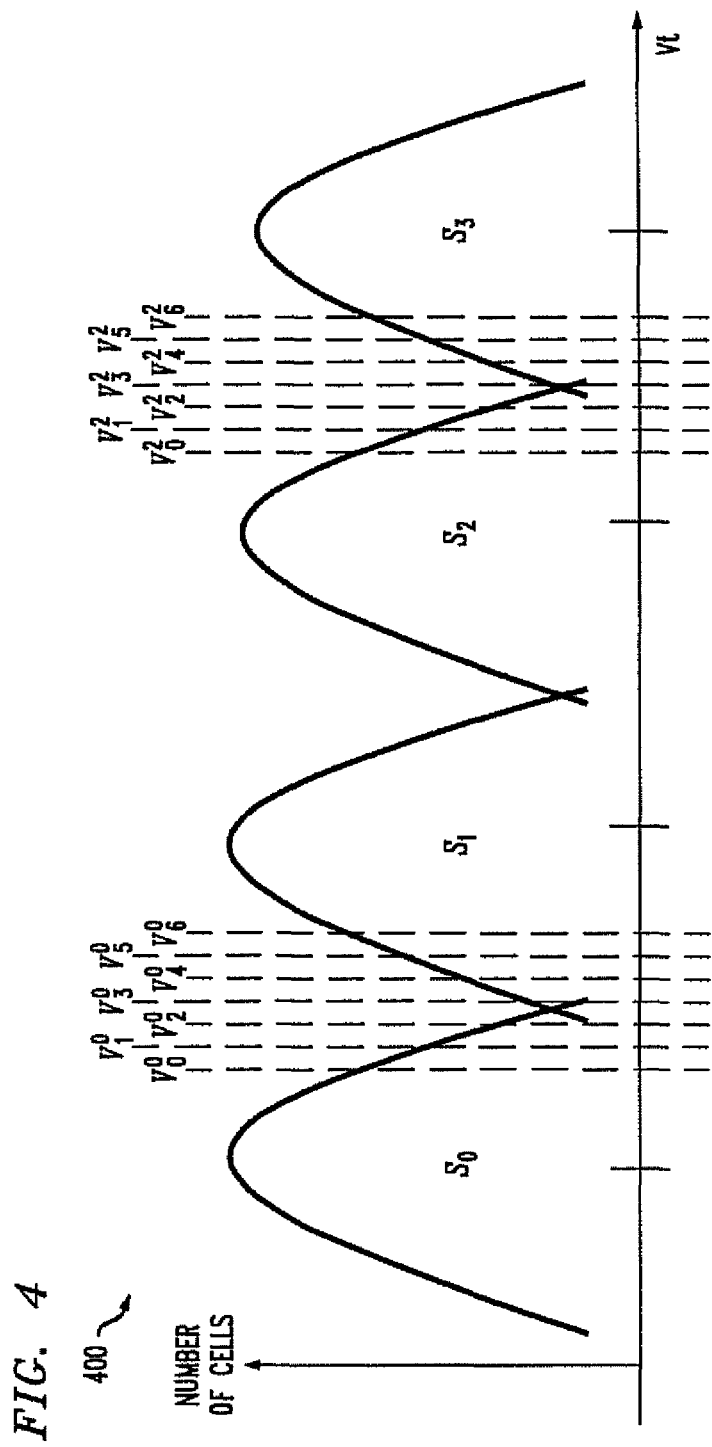

FIG. 4 illustrates an exemplary soft read operation 400 with seven exemplary hard decision read operations with different Vrefs $V_0$-$V_6$ for obtaining soft decisions on a most significant bit (MSB) page. As shown in FIG. 4, seven exemplary HD read operations can be performed with different Vrefs $V_0$-$V_6$ for the transition between states $S_0$ and $S_1$ and the transition between states $S_2$ and $S_3$ corresponding to the MSB in FIG. 4 (i.e., around the cross point of the corresponding distributions $S_0/S_1$ and $S_2/S_3$). The HD read operations can be performed by the flash controller 120 or the flash memory device 160 itself (if the device 160 has a built-in soft read command).

It is noted that each read of an MSB page requires a pair of Vrefs. As shown in FIG. 4, $V_0^0$ and $V_0^2$ comprise the pair of Vrefs to be applied for the same read. Similarly, $V_n^0$ and $V_n^2$ comprise the Vref pair for the n-th read. As indicated above, a soft read operation thus divides the entire Vt region into a number of decision regions (e.g., the 14 regions created by Vrefs $V_0^0$-$V_6^0$ and by Vrefs $V_0^2$-$V_6^2$ in FIG. 4) around the cross points of the corresponding distributions.

As used herein, the term "trunk region" of the Vt distribution corresponds to the end regions of the Vt distribution (e.g., indexes i of 0 or 6), as well as the region between $V_6^0$ and $V_0^2$ in FIG. 4, while the term "tail region" of the Vt distribution corresponds to the middle regions of the Vt distribution (e.g., indexes i of 1-5). As discussed hereinafter, aspects of the present invention provide reduced complexity reliability values for the regions between two adjacent Vrefs (i.e., for tail regions)

Computing Soft Decisions

Figure 5:
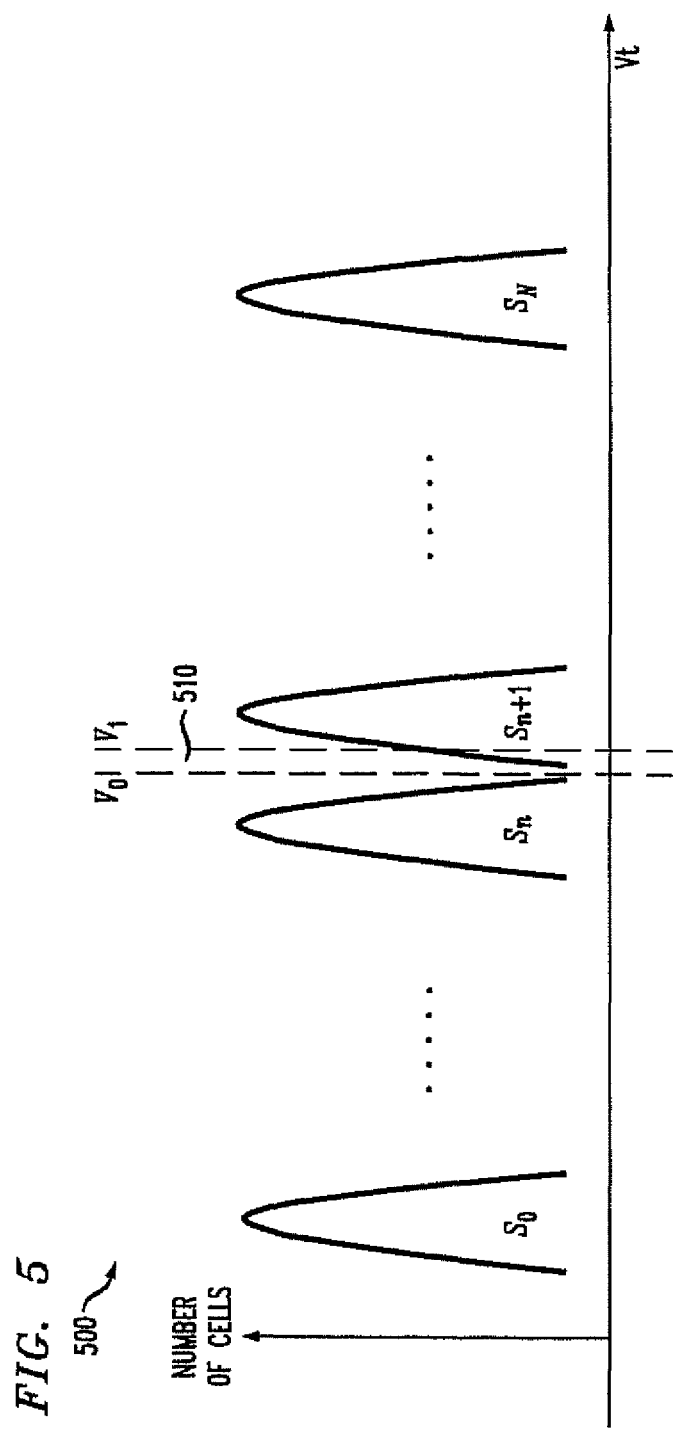
FIG. 5 illustrates an exemplary computation of a soft decision for a multi-level cell having a voltage distribution with an arbitrary number states N, in accordance with aspects of the present invention.

FIG. 5 illustrates an exemplary computation of a soft decision for a multi-level cell having a voltage distribution 500 with an arbitrary number of states N. The soft decision is computed for an exemplary region 510 between Vrefs $V_0$ and $V_1$ positioned between states $S_n$ and $S_{n+1}$. The LLR for region 510 (i.e., the region between Vrefs $V_0$ and $V_1$) can be expressed as follows, in a known manner:

$$LLR = \ln\left(\frac{\sum_{x=1} \int_{V_0}^{V_1} f(v; \mu_i, \sigma_i^2)\,dv}{\sum_{x=0} \int_{V_0}^{V_1} f(v; \mu_j, \sigma_j^2)\,dv}\right) \quad (1)$$

In Equation (1), $f(v;\mu_i,\sigma_i^2)$ represents the probability density function (PDF) of the i-th voltage distribution, where x indicates the bit that has been stored in this cell and this page level (e.g., lower page, middle page, and upper page, etc.). Thus, Equation (1) considers the PDF for each separate state, such as the four states $S_0$-$S_3$ of FIGS. 3 and 4. As indicated above, a Gaussian PDF is completely defined by its mean $\mu_i$ and variance $\sigma_i$. Both the numerator and the denominator of Equation (1) are summations on $2^{\wedge}(M-1)$ items.

Computing Soft Decisions with Reduced Complexity

Aspects of the present invention recognize that the LLR computation in accordance with Equation (1) can be simplified by only considering two adjacent distributions for two adjacent states, e.g., $S_n$ and $S_{n+1}$ in FIG. 5 (regardless of Gray code mapping and page types (e.g., lower/middle/upper pages) being read)

Therefore, a simplified LLR can be expressed as follows:

$$LLR \approx \ln\left(\frac{\int_{V_0}^{V_1} f(v; \mu_n, \sigma_n^2)\,dv}{\int_{V_0}^{V_1} f(v; \mu_{n+1}, \sigma_{n+1}^2)\,dv}\right) \quad (2)$$

Thus, Equation (2) considers the PDF for only for two adjacent states, such as states $S_1$-$S_2$ of FIGS. 3 and 4. The benefit of this simplification is complexity reduction of about 50% for MLC, 75% for TLC, and 87.5% for 4-bit-per cell. The reduced complexity will lead to a reduction of cost and an improvement of throughput performance.

According to a further aspect of the invention, Equation (2) can be further simplified using the following approximation:

$$\int_{V_0}^{V_1} f(v;\mu,\sigma^2)\,dv \approx (V_1-V_0)*f(0.5(V_1+V_0);v,\sigma^2) \quad (3)$$

Therefore, equation (2) can be further simplified as follows:

$$LLR \approx \ln\left(\frac{f(0.5(V_1+V_0); \mu_n, \sigma_n^2)}{f(0.5(V_1+V_0); \mu_{n+1}, \sigma_{n+1}^2)}\right) \quad (4)$$

Note that Equation (4) is a convenient form that can be further simplified if the cell voltage is modeled as commonly used distributions such as Gaussian, log Gaussian, or Poisson distributions. For example, when the cell voltages are modeled as Gaussian distributions, equation (4) becomes $$LLR = \ln(\sigma_{n+1}) - \ln(\sigma_n) + \frac{(V-\mu_{n+1})^2}{2\sigma_{n+1}^2} - \frac{(V-\mu_n)^2}{2\sigma_n^2} \quad (5)$$

where $0.5(V_1+V_0)$ from Equation (4) is denoted as V in Equation (5).

Process, System and Article of Manufacture Details

While a number of flow charts herein describe an exemplary sequence of steps, it is also an embodiment of the present invention that the sequence may be varied. Various permutations of the algorithm are contemplated as alternate embodiments of the invention. While exemplary embodiments of the present invention have been described with respect to processing steps in a software program, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a tangible recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

We claim:

1. A method for processing data from a flash memory device that stores M bits per cell using 2^M possible states, comprising the steps of:
   obtaining at least two soft read voltage values corresponding to two reference voltages $V_0$ and $V_1$, wherein said two reference voltages $V_0$ and $V_1$ are between two adjacent states of said 2^M possible states; and
   converting said at least two soft read voltage values to a log likelihood ratio for a region between said two reference voltages $V_0$ and $V_1$ using probability density functions only for said two adjacent states, wherein M is greater than one.

2. The method of claim 1, wherein said probability density functions for each of said two adjacent states $S_n$ and $S_{n+1}$ can be expressed as $f(v;\mu_n,\sigma_n^2)$ and $f(v;\mu_{n+1},\sigma_{n+1})$, where said probability density functions are defined by a mean $\mu_n$ and a variance $\sigma_n^2$ and v is the soft read voltage.

3. The method of claim 1, wherein said log likelihood ratio for said region between said two reference voltages $V_0$ and $V_1$ is expressed as follows:

$$LLR \approx \ln\left(\frac{\int_{V_0}^{V_1} f(v;\mu_n,\sigma_n^2)dv}{\int_{V_0}^{V_1} f(v;\mu_{n+1},\sigma_{n+1}^2)dv}\right)$$

where $f(v,\mu_n,\sigma_n^2)$ and $f(v;\mu_{n+1},\sigma_{n+1}^2)$ are probability density functions for said two adjacent states $S_n$ and $S_{n+1}$ defined by a mean $\mu_n$ and a variance $\sigma_n^2$ and v is the soft read voltage.

4. The method of claim 1, wherein said log likelihood ratio for said region between said two reference voltages $V_0$ and $V_1$ is expressed as follows:

$$LLR \approx \ln\left(\frac{f(0.5(V_1+V_0);\mu_n,\sigma_n^2)}{f(0.5(V_1+V_0);\mu_{n+1},\sigma_{n+1}^2)}\right)$$

where $f(0.5(V_1+V_0);\mu_n,\sigma_n^2)$ and $f(0.5(V_1+V_0);\mu_{n+1},\sigma_{n+1}^2)$ are probability density functions for said two adjacent states $S_n$ and $S_{n+1}$ defined by a mean $\mu_n$ and a variance $\sigma_n^2$ and v is the soft read voltage.

5. The method of claim 1, wherein said log likelihood ratio for said region between said two reference voltages $V_0$ and $V_1$ is expressed as follows:

$$LLR = \ln(\sigma_{n+1}) - \ln(\sigma_n) + \frac{(V-\mu_{n+1})^2}{2\sigma_{n+1}^2} - \frac{(V-\mu_n)^2}{2\sigma_n^2}$$

where V is equal to $0.5(V_1+V_0)$ and wherein said two adjacent states $S_n$ and $S_{n+1}$ are defined by a mean $v_n$ and a variance $\sigma_n^2$ and v is the soft read voltage.

6. The method of claim 1, wherein said soft read voltage values comprise one or more of hard decision read values obtained by a plurality of read retries of a given cell at a plurality of reference voltages and soft values obtained from said flash memory device.

7. The method of claim 1, further comprising the step of applying said log likelihood ratios to one or more of a soft decision decoder and a buffer.

8. A non-transitory machine-readable recordable storage medium, wherein one or more software programs when executed by one or more processing devices implement the steps of the method of claim 1.

9. A flash controller for processing data from a flash memory device that stores M bits per cell using 2^M possible states, comprising:
   a log likelihood ratio generation block configured to:
   obtain at least two soft read voltage values corresponding to two reference voltages $V_0$ and $V_1$, wherein said two reference voltages $V_0$ and $V_1$ are between two adjacent states of said 2^M possible states, wherein M is greater than one; and
   convert said at least two soft read voltage values to a log likelihood ratio for a region between said two reference voltages $V_0$ and $V_1$ using probability density functions only for said two adjacent states.

10. The flash controller of claim 9, wherein said probability density functions for each of said two adjacent states $S_n$ and $S_{n+1}$ can be expressed as $f(v;\mu_n,\sigma_n^2)$ and $f(v;\mu_{n+1},\sigma_{n+1}^2)$, where said probability density functions are defined by a mean $\mu_n$ and a variance $\sigma_n^2$ and v is the soft read voltage.

11. The flash controller of claim 9, wherein said log likelihood ratio for said region between said two reference voltages $V_0$ and $V_1$ is expressed as follows:

$$LLR \approx \ln\left(\frac{\int_{V_0}^{V_1} f(v;\mu_n,\sigma_n^2)dv}{\int_{V_0}^{V_1} f(v;\mu_{n+1},\sigma_{n+1}^2)dv}\right)$$

where $f(v;\mu_n,\sigma_n^2)$ and $f(v;\mu_{n+1},\sigma_{n+1}^2)$ are probability density functions for said two adjacent states $S_n$ and $S_{n+1}$ defined by a mean $\mu_n$ and a variance $\sigma_{n+1}$ and v is the soft read voltage.

12. The flash controller of claim 9, wherein said log likelihood ratio for said region between said two reference voltages $V_0$ and $V_1$ is expressed as follows:

$$LLR \approx \ln\left(\frac{f(0.5(V_1+V_0);\mu_n,\sigma_n^2)}{f(0.5(V_1+V_0);\mu_{n+1},\sigma_{n+1}^2)}\right)$$

where $f(0.5(V_1+V_0);\mu_n,\sigma_n^2)$ and $f(0.5(V_1+V_0);\mu_{n+1},\sigma_{n+1}^2)$ are probability density functions for said two adjacent states $S_n$ and $S_{n+1}$ defined by a mean $\mu_n$ and a variance $\sigma_n^2$ and v is the soft read voltage.

13. The flash controller of claim 9, wherein said log likelihood ratio for said region between said two reference voltages $V_0$ and $V_1$ is expressed as follows:

$$LLR = \ln(\sigma_{n+1}) - \ln(\sigma_n) + \frac{(V-\mu_{n+1})^2}{2\sigma_{n+1}^2} - \frac{(V-\mu_n)^2}{2\sigma_n^2}$$

where V is equal to $0.5(V_1+V_0)$ and wherein said two adjacent states $S_n$ and $S_{n+1}$ are defined by a mean $\mu_n$ and a variance $\sigma_n^2$ and v is the soft read voltage.

14. The flash controller of claim 9, wherein said soft read voltage values comprise one or more of hard decision read values obtained by a plurality of read retries of a given cell at a plurality of reference voltages and soft values obtained from said flash memory device.

15. The flash controller of claim 9, wherein said log likelihood ratio generation block is further configured to apply said log likelihood ratios to one or more of a soft decision decoder and a buffer.

16. An integrated circuit, comprising:
a flash controller for processing data from a flash memory device that stores M bits per cell using 2^M possible states, comprising:
a log likelihood ratio generation block configured to:
obtain at least two soft read voltage values corresponding to two reference voltages $V_0$ and $V_1$, wherein said two reference voltages $V_0$ and $V_1$ are between two adjacent states of said 2^M possible states, wherein M is greater than one; and
convert said at least two soft read voltage values to a log likelihood ratio for a region between said two reference voltages $V_0$ and $V_1$ using probability density functions only for said two adjacent states.

17. The integrated circuit of claim 16, wherein said probability density functions for each of said two adjacent states $S_n$ and $S_{n+1}$ can be expressed as $f(v;\mu_n,\sigma_n^2)$ and $f(v;\mu_n,\sigma_{n+1}^2)$, where said probability density functions are defined by a mean $\mu_n$ and a variance $\sigma_n^2$ and v is the soft read voltage.

18. The integrated circuit of claim 16, wherein said log likelihood ratio for said region between said two reference voltages $V_0$ and $V_1$ is expressed as follows:

$$LLR \approx \ln\left(\frac{\int_{V_0}^{V_1} f(v;\mu_n,\sigma_n^2)dv}{\int_{V_0}^{V_1} f(v;\mu_{n+1},\sigma_{n+1}^2)dv}\right)$$

where $f(v;\mu_n,\sigma_n^2)$ and $f(v;\mu_{n+1},\sigma_{n+1}^2)$ are probability density functions for said two adjacent states $S_n$ and $S_{n+1}$ defined by a mean $\mu_n$ and a variance $\sigma_n^2$ and v is the soft read voltage.

19. The integrated circuit of claim 16, wherein said soft read voltage values comprise one or more of hard decision read values obtained by a plurality of read retries of a given cell at a plurality of reference voltages and soft values obtained from said flash memory device.

20. The integrated circuit of claim 16, wherein said log likelihood ratio generation block is further configured to apply said log likelihood ratios to one or more of a soft decision decoder and a buffer.

* * * * *

UNITED STATES PATENT AND TRADEMARK OFFICE
CERTIFICATE OF CORRECTION

| | | |
|---|---|---|
| PATENT NO. | : 9,053,804 B2 | Page 1 of 1 |
| APPLICATION NO. | : 13/777484 | |
| DATED | : June 9, 2015 | |
| INVENTOR(S) | : Yunxiang Wu et al. | |

It is certified that error appears in the above-identified patent and that said Letters Patent is hereby corrected as shown below:

Title Page

Item (71) Applicant, replace "LSI Corporation, San Jose, CA," with --Seagate Technology LLC, Cupertino, CA--.

Specification

In Column 1, line 13, replace "Storage Systems," and United" with --Storage Systems;" United--.

In Column 1, line 17, replace "2010, and U.S. patent" with --2010; U.S. patent--.

In Column 1, line 20, replace "(now U.S. Pat. No. 8,462,549)," with --(now U.S. Pat. No. 8,462,549);--.

In Column 5, line 2, replace "that for example the error" with --that, for example, the error--.

In Column 5, line 29, replace "errors but they" with --errors, but they--.

In Column 5, line 48, replace the word "corresponding" with --correspond--.

In Column 7, line 23, replace "being read)" with --being read).--.

In Column 7, line 32, delete "for" after "for only" and before "two.".

Signed and Sealed this
Twelfth Day of April, 2016

Michelle K. Lee
*Director of the United States Patent and Trademark Office*